United States Patent
Cho et al.

(10) Patent No.: US 11,285,701 B2
(45) Date of Patent: Mar. 29, 2022

(54) HEAT SINK PLATE

(71) Applicants: THE GOODSYSTEM CORP., Ansan-si (KR); DOWA METALTECH CO., LTD., Tokyo (JP)

(72) Inventors: Meoung-whan Cho, Yongin-si (KR); Il-ho Kim, Yongin-si (KR); Seog-woo Lee, Hwaseong-si (KR); Young-suk Kim, Suwon-si (KR); Hiroto Narieda, Tokyo (JP); Tomotsugu Aoyama, Tokyo (JP)

(73) Assignees: THEGOODSYSTEM CORP., Ansan-si (KR); DOWA METALTECH CO., LTD., Tokyo (JP)

( * ) Notice: Subject to any disclaimer, the term of this patent is extended or adjusted under 35 U.S.C. 154(b) by 143 days.

(21) Appl. No.: 16/800,833

(22) Filed: Feb. 25, 2020

(65) Prior Publication Data
US 2020/0290316 A1 Sep. 17, 2020

(30) Foreign Application Priority Data

Mar. 11, 2019 (KR) .................. 10-2019-0027446
Nov. 22, 2019 (KR) .................. 10-2019-0151437

(51) Int. Cl.
| | |
|---|---|
| *B32B 15/20* | (2006.01) |
| *B32B 15/01* | (2006.01) |
| *C22C 9/00* | (2006.01) |
| *F28F 21/08* | (2006.01) |
| *H01L 23/373* | (2006.01) |

(52) U.S. Cl.
CPC .............. *B32B 15/20* (2013.01); *B32B 15/01* (2013.01); *C22C 9/00* (2013.01); *F28F 21/085* (2013.01); *B32B 2250/05* (2013.01); *B32B 2307/302* (2013.01); *B32B 2309/105* (2013.01); *B32B 2311/12* (2013.01); *H01L 23/3735* (2013.01); *H01L 23/3736* (2013.01); *Y10T 428/12903* (2015.01)

(58) Field of Classification Search
None
See application file for complete search history.

(56) References Cited

U.S. PATENT DOCUMENTS

2012/0100392 A1* 4/2012 Nitta .................. C25D 3/66
428/663
2018/0328677 A1* 11/2018 Kim .................... F28F 21/089

FOREIGN PATENT DOCUMENTS

| JP | 2016-127197 A | 7/2016 |
| KR | 2018-0097021 A | 8/2018 |

* cited by examiner

*Primary Examiner* — Seth Dumbris
(74) *Attorney, Agent, or Firm* — Novick, Kim & Lee, PLLC; Jae Youn Kim; Jihun Kim

(57) ABSTRACT

A heat sink plate includes a first layer made of copper (Cu) or a copper (Cu) alloy, a second layer formed on the first layer and made of molybdenum (Mo) or an alloy that includes copper (Cu) and one or more components selected from molybdenum (Mo), tungsten (W), carbon (C), chromium (Cr), titanium (Ti), and beryllium (Be), a third layer formed on the second layer and made of copper (Cu) or a copper (Cu) alloy, a fourth layer formed on the third layer and made of molybdenum (Mo) or an alloy that includes copper (Cu) and one or more components selected from molybdenum (Mo), tungsten (W), carbon (C), chromium (Cr), titanium (Ti), and beryllium (Be), and a fifth layer formed on the fourth layer and made of copper (Cu) or a copper (Cu) alloy.

14 Claims, 3 Drawing Sheets

HEAT SINK PLATE

BACKGROUND OF THE INVENTION

1. Field of the Invention

The present invention relates to a heat sink plate and, more specifically, to a heat sink plate which may be adequately used for packaging a high power element. The heat sink plate has a coefficient of thermal expansion similar to that of a ceramic material such as alumina ($Al_2O_3$) to achieve favorable bonding even when bonded to an element including the ceramic material, exhibits high thermal conductivity to rapidly discharge a large amount of heat generated from the high power element to the outside, and has very excellent bonding forces between layers constituting a stacked structure.

2. Description of the Related Art

In recent years, as core technology in fields of information and communication, and national defense, a high power amplifier element using a GaN-based compound semiconductor has attracted attention.

Such a high power electronic element or optical element generates a larger amount of heat than general elements, and thus packaging technology for efficiently discharging the large amount of generated heat is required.

Currently, a metal composite plate having relatively favorable thermal conductivity and a low coefficient of thermal expansion, such as a two-layered composite material of tungsten (W)/copper (Cu), a two phase composite material of copper (Cu) and molybdenum (Mo), a three-layered composite material of copper (Cu)/copper-molybdenum (Cu—Mo) alloy/copper (Cu), or a multi-layered composite material of copper (Cu)/molybdenum (Mo)/copper (Cu)/molybdenum (Mo)/copper (Cu), has been used in the high power semiconductor element utilizing the GaN-based compound semiconductor.

However, the thermal conductivity of the composite plate in a thickness direction is about 200 W/mK to 300 W/mK at most, and actually, it is impossible to achieve thermal conductivity higher than these values. Thus, a novel heat sink material or heat sink substrate to be used in an element such as a power transistor of hundreds of watts is urgently required in a market. Also, in a case of a multi-layered composite material of copper (Cu)/molybdenum (Mo)/copper (Cu)/molybdenum (Mo)/copper (Cu), there is a limitation that bonding forces between the layers are low.

In addition, during a process for manufacturing a semiconductor element, a brazing bonding process to the ceramic material such as alumina ($Al_2O_3$) is essentially necessary.

Since such a brazing bonding process is performed at a high temperature of about 800° C. or more, deflection or breakage occurs during the brazing bonding process due to a difference in coefficients of thermal expansion between a metal composite substrate and a ceramic material. This deflection or breakage has a fatal effect on the reliability of an element.

To meet this demand, the inventors of the invention suggests a heat sink plate including cover layers (first and fifth layers) made of copper (Cu), intermediate layers (second and fourth layers) made of an alloy of copper (Cu) and molybdenum (Mo), and a core layer having a structure in which a copper (Cu) layer and a molybdenum (Mo) layer are alternately repeated along a direction parallel to the top and bottom surfaces of a heat sink plate, as disclosed in Patent Document 2 below. Although the heat sink plate having the above-described structure exhibits excellent thermal conductivity of 400 W/mK or higher while having a coefficient of thermal expansion same as or similar to that of a ceramic material, there is a limitation that the number of manufacturing processes and process costs increase due to a complicated structure thereof.

Accordingly, development of a heat sink plate has been required, which may have a structure manufactured by a more simple process, have excellent bonding forces between layers, exhibit superior heat conduction characteristics in a thickness direction, and achieve a coefficient of thermal expansion similar to that of a ceramic material in a surface direction perpendicular to the thickness direction.

PRIOR ART DOCUMENT

Patent Document (Patent Document 1) 1. Japanese Patent Application Laid-open (JP-A) No. 2016-127197
(Patent Document 2) 2 Korean Patent Application Laid-open Publication No. 2018-0097021

SUMMARY OF THE INVENTION

The present invention is to provide a heat sink plate having a stacked structure, and the heat sink plate exhibits excellent bonding forces between layers constituting the stacked structure while achieving superior heat conduction characteristics of 300 W/mK or higher in a thickness direction and a coefficient of thermal expansion of $6 \times 10^{-6}$/K to $12 \times 10^{-6}$/K in a surface direction perpendicular to the thickness direction.

According to an embodiment of the present invention, there is provided a heat sink plate including: a first layer made of copper (Cu) or a copper (Cu) alloy; a second layer formed on the first layer and made of molybdenum (Mo) or an alloy that includes copper (Cu) and one or more components selected from molybdenum (Mo), tungsten (W), carbon (C), chromium (Cr), titanium (Ti), and beryllium (Be); a third layer formed on the second layer and made of copper (Cu) or a copper (Cu) alloy; a fourth layer formed on the third layer and made of molybdenum (Mo) or an alloy that includes copper (Cu) and one or more components selected from molybdenum (Mo), tungsten (W), carbon (C), chromium (Cr), titanium (Ti), and beryllium (Be); and a fifth layer formed on the fourth layer and made of copper (Cu) or a copper (Cu) alloy, wherein a cobalt (Co) diffusion layer is formed on each of interfaces between the first, third, and fifth layers and the second and fourth layers disposed therebetween.

DETAILED DESCRIPTION OF THE EXEMPLARY EMBODIMENTS

Hereinafter, preferred embodiments of the present invention will be described in detail with reference to the accompanying drawings. However, the embodiments of the invention may be embodied in different forms, and the scope of the invention is not limited to the embodiments set forth herein. Embodiments of the invention are provided to explain the invention more completely to those skilled in the art to which the invention pertains.

A heat sink plate according to the present invention includes a first layer made of copper (Cu) or a copper (Cu) alloy, a second layer formed on the first layer and made of molybdenum (Mo) or an alloy that includes copper (Cu) and one or more components selected from molybdenum (Mo), tungsten (W), carbon (C), chromium (Cr), titanium (Ti), and beryllium (Be), a third layer formed on the second layer and made of copper (Cu) or a copper (Cu) alloy, a fourth layer formed on the third layer and made of molybdenum (Mo) or an alloy that includes copper (Cu) and one or more components selected from molybdenum (Mo), tungsten (W), carbon (C), chromium (Cr), titanium (Ti), and beryllium (Be), and a fifth layer formed on the fourth layer and made of copper (Cu) or a copper (Cu) alloy. A cobalt (Co) diffusion layer is formed on each of interfaces between the first, third, and fifth layers and the second and fourth layers disposed therebetween.

Figure 1:
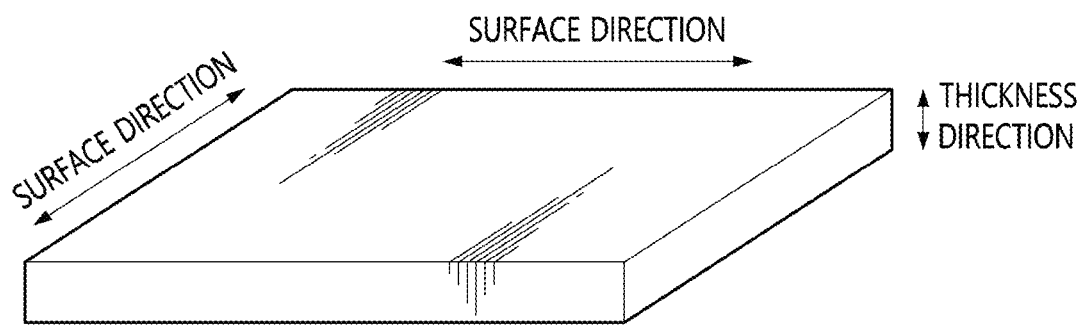
FIG. 1 is a view for explaining a thickness direction and a surface direction of a heat sink plate.

In the present invention, the 'thickness direction' indicates a direction perpendicular to a surface of the heat sink plate, and the 'surface direction' indicates a direction parallel to the surface of the plate, as illustrated in FIG. 1.

Also, the 'cobalt (Co) diffusion layer' indicates a region that the cobalt (Co) is dissolved in matrices of the first, third, and fifth layers made of copper (Cu) or a copper (Cu) alloy, and the second and fourth layers made of molybdenum (Mo) or an alloy that includes copper (Cu) and one or more components selected from molybdenum (Mo), tungsten (W), carbon (C), chromium (Cr), titanium (Ti), and beryllium (Be), due to diffusion of cobalt (Co) element from the interface, or that the cobalt (Co) exists as a compound with materials constituting the matrices. This region exhibits substantially higher cobalt (Co) concentration to an analyzable level when compared to a content of cobalt (Co) contained in a material constituting each of the layers.

The heat sink plate according to the present invention includes a five-layered structure of a copper (Cu) layer/a molybdenum (Mo) layer or an alloy layer/a copper (Cu) layer/a molybdenum (Mo) layer or an alloy layer/a copper (Cu) layer. As being formed of at least five-layer structure, the heat sink plate may have a coefficient of thermal expansion in the thickness direction that is maintained at $6 \times 10^{-6}/K$ to $12 \times 10^{-6}/K$ through the molybdenum (Mo) layer and the alloy layer having a low coefficient of thermal expansion. Also, the cobalt (Co) diffusion layer having a predetermined thickness is formed on the interfaces between the first, third, and fifth layers and the second and fourth layers disposed therebetween, and thus bonding forces between the layers may be significantly improved.

Here, although the five-layered structure is described in the present invention, the present invention should be interpreted as including additional stacking of another layer on the five-layered structure.

Each of the first, third, and fifth layers may be made of a copper (Cu) alloy including various alloy elements as well as 99 wt % or more of copper (Cu), and the copper (Cu) alloy may include 80 wt % or more of copper (Cu), preferably 90 wt % or more, and more preferably 95 wt % or more, when taking heat dissipation characteristics into consideration.

Each of the second and fourth layers may be made of an alloy including 5-40 wt % of copper (Cu), the balance of one or more components selected from molybdenum (Mo), tungsten (W), carbon (C), chromium (Cr), titanium (Ti), and beryllium (Be), and inevitable impurities. Here, the inevitable impurities are impurities unintentionally introduced into an alloy during a process for manufacturing the alloy. It is more preferable to use the alloy including the copper (Cu) as described above because the low coefficient of thermal expansion may be obtained while the bonding force with the copper (Cu) layer is enhanced, and the thermal conductivity in the thickness direction may also be improved.

In a case in which each of the second and fourth layers is made of a molybdenum (Mo)-copper (Cu) alloy including 60-95 wt % of molybdenum (Mo) and 5-40 wt % of copper (Cu), it is advantageous when forming the cobalt (Co) diffusion layer because cobalt (Co) has good solubility to molybdenum (Mo) and copper (Cu), and thus the bonding forces between the layers increase preferably. When the copper (Cu) content is less than 5 wt %, the thermal conductivity in the thickness direction may be reduced, but when greater than 40 wt %, it may be difficult to maintain a low coefficient of thermal expansion in the surface direction. Thus, it is preferable to maintain the range described above.

When the content of cobalt (Co) contained in the entire heat sink plate is less than 0.003 wt %, it is difficult to sufficiently enhance the bonding force because the diffusion layer is not sufficiently formed, but when the content of cobalt (Co) is greater than 5 wt %, it is difficult to set the thermal conductivity and the coefficient of thermal expansion of the heat sink plate to a desired level. Thus, it is preferable to maintain the range of 0.003-5 wt %.

The thickness of the cobalt (Co) diffusion layer should be 0.05 μm or more so as to obtain an improvement in bonding force above a certain level. A large amount of cobalt (Co) or a process time is required to make the thickness exceed 100 μm, but an improvement in bonding force is not great. Thus, it is preferable to be 100 μm or less. The more preferable thickness of the cobalt (Co) diffusion layer is 0.1 μm to 10 μm.

A cobalt (Co) layer in which cobalt (Co) exists in a single phase can be inside the cobalt (Co) diffusion layer. Here, the single phase of cobalt (Co) is a layer in which a cobalt (Co) is not completely diffused and thus remains after a manufacturing process.

It is preferable that the cobalt (Co) diffusion layer is formed on both sides of the interface to improve the bonding force.

When the thickness of each of the first, third, and fifth layers is maintained in the range of 10 μm to 1000 μm, the coefficient of thermal expansion of the heat sink plate in the surface direction may be maintained in the range of $6 \times 10^{-6}/K$ to $12 \times 10^{-6}/K$, and the thermal conductivity of 300 W/mK or more in the thickness direction may be obtained. Thus, it is preferable that the thickness is maintained in the range described above.

When the total thickness of the heat sink plate is 1100 μm, it is difficult to maintain the coefficient of thermal expansion in the surface direction in the range of $6\times10^{-6}$/K to $12\times10^{-6}$/K if the thickness of each of the second and fourth layers is less than 10 μm, but when greater than 110 μm, it is difficult to obtain the thermal conductivity of 300 W/mK in the thickness direction. Thus, it is preferable that the thickness of the second and fourth layers is maintained in the range of 10 μm to 110 μm. When the total thickness of the heat sink plate is varied, it is preferable to adjust to increase the thicknesses of the second and fourth layers proportionally when the total thickness increases, and to adjust to decrease the thickness of the second and fourth layers proportionally when the total thickness decreases.

In the entire heat sink plate, when the content of molybdenum (Mo) is less than 3 wt %, it is difficult to obtain the coefficient of thermal expansion of $12\times10^{-6}$/K or less in the surface direction, but when the content of molybdenum (Mo) is greater than 15 wt %, it is difficult to obtain the thermal conductivity of 300 W/mK or more in the thickness direction. Thus, it is preferable to maintain the content of molybdenum (Mo) in the range of 3-15 wt %, and it is more preferable to maintain the content of molybdenum (Mo) in the range of 5-10 wt % in terms of the coefficient of thermal expansion in the surface direction and the thermal conductivity.

In the heat sink plate, it is preferable that the coefficient of thermal expansion of the heat sink plate in the surface direction is $6\times10^{-6}$/K to $12\times10^{-6}$/K because, when out of the range described above, failure due to a difference in coefficients of thermal expansion easily occurs when bonded with a ceramic element or in use.

In the heat sink plate, the thermal conductivity in the thickness direction is 300 W/mK or more, and more preferably, 350 W/mK or more.

In the heat sink plate, when the total thickness is less than 0.5 mm or greater than 5 mm, it might be difficult to obtain the coefficient of thermal expansion of $6\times10^{-6}$/K to $12\times10^{-6}$/K in the surface direction and the thermal conductivity of 300 W/mK or more through the heat sink plate having the structure according to the present invention. Thus, it is preferable that the total thickness is maintained in the range described above.

In the heat sink plate, when a sum of thicknesses of the second and fourth layers is less than 5% of the thickness of the entire heat sink plate, it is not easy to obtain the coefficient of thermal expansion of $6\times10^{-6}$/K to $12\times10^{-6}$/K in the surface direction, and when greater than 35%, it is not easy to obtain the thermal conductivity in the thickness direction. Thus, it is preferable to maintain the range of 5-35%.

Embodiment

Figure 2:
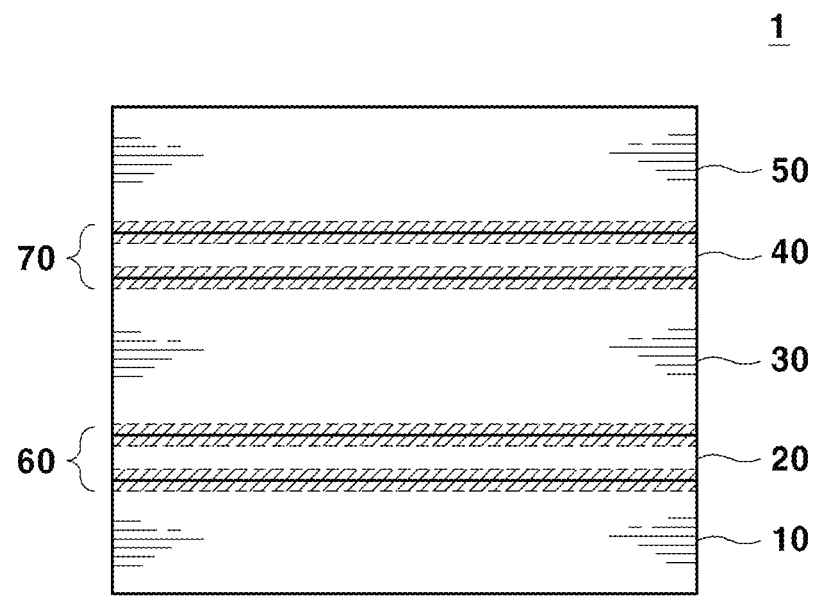
FIG. 2 is a view illustrating a stacked structure of a heat sink plate according to an embodiment of the present invention.

FIG. 2 is a view illustrating a stacked structure of a heat sink plate according to an embodiment of the present invention.

Embodiment 1

As illustrated in FIG. 2, a heat sink plate 1 according to an embodiment of the present invention includes a first layer 10 made of copper (Cu), a second layer 20 formed on the top surface of the first layer 10 and made of a molybdenum (Mo)-copper (Cu) alloy, a third layer 30 formed on the top surface of the second layer 20 and made of a copper (Cu), a fourth layer 40 formed on the top surface of the third layer 30 and made of a molybdenum (Mo)-copper (Cu) alloy, and a fifth layer 50 formed on the top surface of the fourth layer 40 and made of copper (Cu).

Also, a first cobalt diffusion layer 60 (a region marked by oblique lines in the drawing) is formed on each of interfaces with the second layer 20 disposed between the first layer 10 and the third layer 30, and a second cobalt diffusion layer 70 (a region marked by oblique lines in the drawing) is formed on each of interfaces with the fourth layer 40 disposed between the third layer 30 and the fifth layer 50.

Among the layers, each of the first layer 10 and the fifth layer 50 is made of copper (Cu) containing 99 wt % or more of copper (Cu) and has the thickness of about 200 μm, the third layer is made of copper (Cu) containing 99% or more of copper (Cu) and has the thickness of about 600 μm, and each of the second layer 20 and the fourth layer 40 is made of a molybdenum (Mo)-copper (Cu) alloy (Mo: 80 wt %, Cu: 20 wt %) and has a thickness of about 50 μm. Each of the first cobalt diffusion layer 60 and the second cobalt diffusion layer 70 has the thickness of about 0.5 μm to 5 μm, and the thickness of the diffusion layer may be varied according to process conditions such as a process temperature and a cooling rate.

The heat sink plate 1 having the above-described structure was manufactured through the following processes.

First, a copper (Cu) plate having the thickness of about 200 μm, the length of 100 mm, and the width of 100 mm was prepared as a raw material for each of the first layer 10 and the fifth layer 50, a copper (Cu) plate having the thickness of about 600 μm, the length of 100 mm, and the width of 100 mm was prepared as a raw material for the third layer 30, and a molybdenum (Mo)-copper (Cu) alloy plate (Mo: 80%, Cu: 20 wt %) having the thickness of about 50 μm, the length of 100 mm, and the width of 100 mm was prepared as a raw material for each of the second layer 20 and the fourth layer 40.

Subsequently, a cobalt (Co) layer was deposited and formed, on a surface of each of the first layer 10, the third layer 30, and the fifth layer 50, to a thickness of about 500 nm by using a sputtering method.

The layers are stacked on each other to build the structure of FIG. 2 by bring portions having the cobalt (Co) layers into contact with the second layer 20 and the fourth layer 40, and then are bonded to each other by a pressing and sintering method. At the moment, a sintering temperature was set to 900° C., and cooling was performed in a sintering furnace after the sintering.

Component mapping was performed using an EDS for the interface of the heat sink plate manufactured as described above, and the result is shown in FIG. 3.

Figure 3:
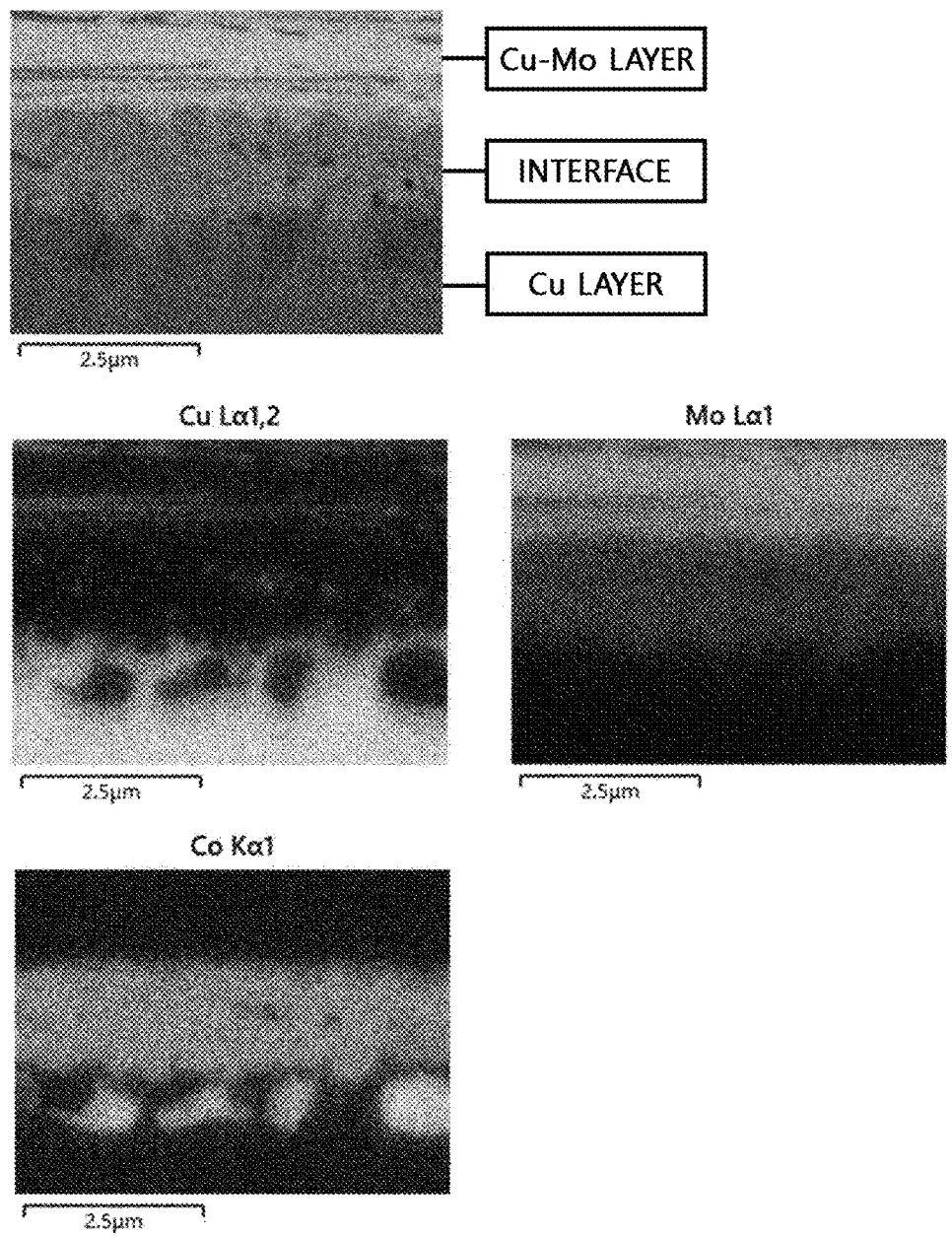
FIG. 3 shows an analysis result of energy dispersive X-ray spectrometer (EDS) for an interface of a heat sink plate manufactured according to Embodiment 1 of the present invention.

As shown in FIG. 3, it may be found that, on the interface between a molybdenum (Mo)-copper (Cu) alloy layer and a copper (Cu) layer made of copper (Cu), at least a portion of the cobalt (Co) layer formed before pressed and sintered is being diffused into both the copper (Cu) layer and molybdenum (Mo)-copper (Cu) alloy layer. The cobalt (Co) diffusion layer manufactured as described above may improve a bonding force between the copper (Cu) layer and the molybdenum (Mo)-copper (Cu) layer.

In order to evaluate bonding forces between the layers of the heat sink plate manufactured according to an embodiment of the present invention, a test specimen of length 10 mm and width 20 mm was cut out from the pressed and sintered heat sink plate. And bottom surface of bolts (M16) were bonded (under hydrogen atmosphere at 800° C.) to both surfaces of the specimen by using silver soldering (BAg-8), and both sides of a leg portion of the bolt was chucked by using a universal test machine (AG-300kNX), and the test continued at a constant deformation speed (1 mm/min) until the interface was broken. As a result, bonding strength was 352 MPa. Therefore, it was confirmed that the bonding forces between the layers of the heat sink plate manufactured according to an embodiment of the present invention are very excellent.

Embodiment 2

A heat sink plate was manufactured by the same method as Embodiment 1, except that a thickness of a deposited cobalt (Co) layer is about 70 nm. Bonding strength of Embodiment 2 was 344 MPa. A thickness of each of the first cobalt diffusion layer 60 and the second cobalt diffusion layer 70 was 1 μm.

Figure 4:
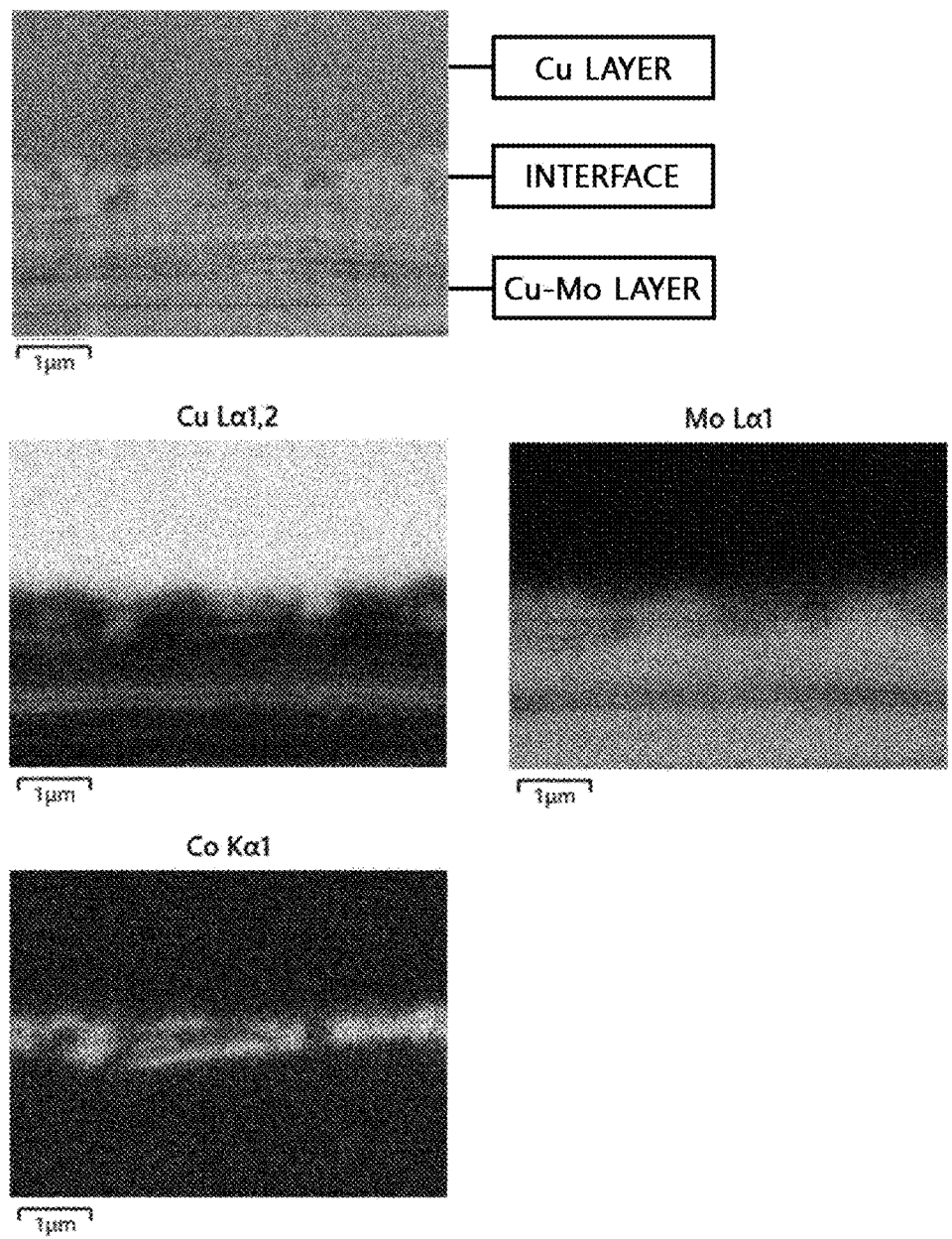
FIG. 4 shows an analysis result of energy dispersive X-ray spectrometer (EDS) for an interface of a heat sink plate manufactured according to Embodiment 2 of the present invention.

Component mapping was performed using an EDS for the interface of the heat sink plate manufactured as described above, and the result is shown in FIG. 4. As shown in FIG. 4, it may be found in Embodiment 2 that, on the interface between a molybdenum (Mo)-copper (Cu) alloy layer and a copper (Cu) layer made of copper (Cu), at least a portion of the cobalt (Co) layer formed before pressed and sintered is being diffused into both the copper (Cu) layer and molybdenum (Mo)-copper (Cu) alloy layer as in Embodiment 1.

Embodiment 3

A heat sink plate was manufactured by the same method as Embodiment 2, except that a thickness of each of the first layer 10 and the fifth layer 50 is about 400 μm, and a thickness of the third layer 30 is about 200 μm. Bonding strength of Embodiment 3 was 321 MPa.

Embodiment 4

A heat sink plate was manufactured by the same method as Embodiment 3, except that each of the second layer 20 and the fourth layer 40 is made of molybdenum (Mo) containing 99 wt % or more of molybdenum (Mo) and has a thickness of about 50 μm. Bonding strength of Embodiment 4 was 267 MPa.

Comparative Example 1

A heat sink plate was manufactured by the same method as Embodiment 3, except that a cobalt (Co) layer is not deposited. Bonding strength of Comparative Example 1 was 294 MPa.

Comparative Example 2

A heat sink plate was manufactured by the same method as Embodiment 4, except that a cobalt (Co) layer is not deposited. Bonding strength of Comparative Example 2 was 139 MPa.

Also, in the heat sink plate manufactured according to an embodiment of the present invention, the copper (Cu) layer is in an expanded state due to intense tensile stress, caused by a difference in coefficients of thermal expansion between the copper (Cu) layer and the molybdenum (Mo) layer, or the molybdenum (Mo)-copper (Cu) alloy layer. When a temperature of the heat sink plate increases during a process (for example, a brazing process) for bonding the heat sink plate in a state in which the tensile stress is applied, the stress is relieved, and the copper (Cu) expanded already at a certain amount reduces expansion rate additionally, thereby lowering the overall coefficient of thermal expansion of the heat sink plate. Also, the molybdenum (Mo)-copper (Cu) alloy layer, disadvantageous to the thermal conductivity, in the heat sink plate manufactured according to the present invention is made thin, having a thickness of 50 μm, which may increase the thermal conductivity in the thickness direction.

Meanwhile, although the plates are prepared and bonded to each other by the pressing and sintering method in the embodiment of the present invention, the stacked structure according to the present invention may be achieved by various methods such as plating and deposition.

In Table 1 below, results obtained by measuring a coefficient of thermal expansion in the surface direction and thermal conductivity in the thickness direction (the mean value obtained by averaging values at 10 arbitrary points selected on the heat sink plate) in the heat sink plate manufactured according to the embodiments of the present invention are compared with results obtained by measuring thermal conductivity and a coefficient of thermal expansion of a pure copper plate. Also, the measurement of the thermal conductivity was performed by using LFA467 (supplied by NETZSCH) and DSC200F3 (supplied by NETZSCH) under nitrogen atmosphere at 25° C. Also, the coefficient of thermal expansion was measured by using DIL402C (supplied by NETZSCH) in the temperature range from a room temperature to 800° C. Here, a heating rate was 10° C./min under argon atmosphere.

TABLE 1

| Classification | Thickness direction Thermal conductivity (W/mK) | 800° C. Coefficient of thermal expansion (× 10⁻⁶/K) |
|---|---|---|
| Embodiment 1 | 355 | 10.9 |
| Embodiment 2 | 360 | 8.5 |
| Embodiment 3 | 358 | 8.3 |
| Embodiment 4 | 266 | 6.4 |
| Comparative Example 1 | 356 | 8.4 |
| Comparative Example 2 | 265 | 6.5 |
| Comparative example (pure copper plate) | 380 | 17 |

As shown in Table 1, the coefficients of thermal expansion of the heat sink plate according to embodiments of the present invention are $6.4 \times 10^{-6}$/K to $10.9 \times 10^{-6}$/K in the surface direction, and these values are similar to an coefficient of thermal expansion of a ceramic material constituting an electronic element such as a semiconductor element and an optical element. Therefore, deflection and delamination occurring when those elements are mounted may be reduced.

Also, the thermal conductivity, in the thickness direction, of the heat sink plate according to the embodiments of the present invention is excellent, close to that of the plate (Comparative example) made of only copper, and thus may be applied for a heat sink plate of a high power element that generates a large amount of heat.

The heat sink plate according to the embodiment of the present invention has the stacked structure made of the copper (Cu) layer, and the molybdenum (Mo) layer or the alloy that includes copper (Cu) and one or more components selected from molybdenum (Mo), tungsten (W), carbon (C), chromium (Cr), titanium (Ti), and beryllium (Be). The bonding forces between the layers constituting the stacked structure is significantly improved by the cobalt (Co) diffusion layer formed on the interface of each of the layers, and thus the delamination between the layers due to the insufficient bonding force may be prevented.

Also, the heat sink plate according to the embodiment of the present invention may achieve the excellent thermal conductivity of 300 W/mK or higher (more preferably, 350 W/mK or higher) in the thickness direction and the coefficient of thermal expansion in the range of $6\times10^{-6}$/K to $12\times10^{-6}$/K in the surface direction, which are not easily obtained by an existing five-layer stacked structure, and thus may be used to package the high power electronic element or the optical element that generate a larger amount of heat than the general elements.

Also, the heat sink plate according to the embodiment of the present invention has the simple stacked structure, not the complicated structure, such as the lattice structure that vertically stands, and is thus easily manufactured with simple processes.

What is claimed is:

1. A heat sink plate comprising:
a first layer made of copper (Cu) or a copper (Cu) alloy;
a second layer formed on the first layer and made of molybdenum (Mo) or an alloy that comprises copper (Cu) and one or more components selected from molybdenum (Mo), tungsten (W), carbon (C), chromium (Cr), titanium (Ti), and beryllium (Be);
a third layer formed on the second layer and made of copper (Cu) or a copper (Cu) alloy;
a fourth layer formed on the third layer and made of molybdenum (Mo) or an alloy that comprises copper (Cu) and one or more components selected from molybdenum (Mo), tungsten (W), carbon (C), chromium (Cr), titanium (Ti), and beryllium (Be);
a fifth layer formed on the fourth layer and made of copper (Cu) or a copper (Cu) alloy; and
a cobalt (Co) diffusion layer having a predetermined thickness and formed on each of interfaces between the first, third, and fifth layers and the second and fourth layers disposed therebetween.

2. The heat sink plate of claim 1,
wherein a content of the copper (Cu) of each of the first, third, and fifth layers is 99 wt % or more.

3. The heat sink plate of claim 1,
wherein the alloy of the second layer or the alloy of the fourth layer comprises 5-40 wt % of copper (Cu), a balance including one component selected from molybdenum (Mo), tungsten (W), carbon (C), chromium (Cr), titanium (Ti), and beryllium (Be), and inevitable impurities.

4. The heat sink plate of claim 1,
wherein a content of cobalt (Co) in the entire heat sink plate is 0.003-5 wt %.

5. The heat sink plate of claim 1,
wherein each of the second and fourth layers is made of the alloy comprising 5-40 wt % of copper (Cu), the molybdenum (Mo), and inevitable impurities.

6. The heat sink plate of claim 5,
wherein a content of molybdenum (Mo) in the heat sink plate is 3-15 wt %.

7. The heat sink plate of claim 1,
wherein the predetermined thickness of the cobalt (Co) diffusion layer is 50 nm to 100 μm.

8. The heat sink plate of claim 1,
wherein the cobalt (Co) diffusion layer is formed on each of both sides of each of the interfaces.

9. The heat sink plate of claim 1,
wherein a thickness of each of the second and fourth layers is 10 μm to 110 μm.

10. The heat sink plate of claim 1,
wherein a total thickness of the heat sink plate is 0.5 mm to 5 mm.

11. The heat sink plate of claim 10,
wherein a sum of thicknesses of the second and fourth layers accounts for 5-35% of the total thickness of the heat sink plate.

12. The heat sink plate of claim 1,
wherein a coefficient of thermal expansion of the heat sink plate in a surface direction is $6\times10^{-6}$/K to $12\times10^{-6}$/K.

13. The heat sink plate of claim 12,
wherein a thermal conductivity of the heat sink plate in a thickness direction is 200 W/mK or more.

14. The heat sink plate of claim 12,
wherein a thermal conductivity of the heat sink plate in a thickness direction is 300 W/mK or more.

* * * * *